United States Patent [19]

Fu

[11] Patent Number: 5,576,238

[45] Date of Patent: Nov. 19, 1996

[54] PROCESS FOR FABRICATING STATIC RANDOM ACCESS MEMORY HAVING STACKED TRANSISTORS

[75] Inventor: Chien-Chih Fu, Hsinchu, Taiwan

[73] Assignee: United Microelectronics Corporation, Hsinchu, Taiwan

[21] Appl. No.: 490,787

[22] Filed: Jun. 15, 1995

[51] Int. Cl.⁶ .............................. H01L 21/70; H01L 27/00
[52] U.S. Cl. .............. 437/52; 437/915; 437/918
[58] Field of Search .................................. 437/47, 48, 52, 437/918, 915; 257/903–904

[56] References Cited

U.S. PATENT DOCUMENTS

| | | | |
|---|---|---|---|
| 4,656,731 | 4/1987 | Lam et al. | 437/915 |
| 4,828,629 | 5/1989 | Ikeda et al. | 437/52 |
| 5,116,775 | 5/1992 | Katto et al. | 437/52 |

*Primary Examiner*—H. Jey Tsai
*Attorney, Agent, or Firm*—Fish & Richardson, P.C.

[57] ABSTRACT

A process for fabricating memory cells of a static random access memory (SRAM) device is disclosed to reduce the required die area and increase storage capacity. Each of the memory cells of the SRAM comprises a group of four MOS transistors, a pair of resistors, a pair of bit lines, as well as a word line. The process of fabrication the memory cells of the SRAM device comprises a number of process steps that are implemented subsequently on the surface of said semiconductor substrate, with the first and second MOS transistors first formed on the semiconductor substrate. According to the process, the first and second resistors are then formed on top of the first and second MOS transistors. Then the third and fourth MOS transistors and a word line are subsequently formed on top of the first and second resistors. Finally, the first and second bit lines for the memory cells are formed on top of the third and fourth MOS transistors. The process for fabricating the memory cells is characterized by the fact that the third and fourth MOS transistors are fabricated as vertical conduction transistors having their drains, sources and gates aligned substantially in a direction orthogonal to the plane of the semiconductor substrate.

12 Claims, 9 Drawing Sheets

PROCESS FOR FABRICATING STATIC RANDOM ACCESS MEMORY HAVING STACKED TRANSISTORS

BACKGROUND OF THE INVENTION

1. Field of the Invention

The present invention relates in general to a process for fabricating semiconductor static random access memory (SRAM) devices. In particular, the present invention relates to a process for fabricating SRAM devices having reduced semiconductor die area for reduced device size as well as increased device memory storage capacity. More particularly, the present invention relates to a process for fabricating SRAM devices having stacked transistors in memory cells that results in the reduction of the overall surface area requirement of the SRAM devices.

2. Technical Background

Conventional SRAM devices are built around MOS transistors that constitute the memory cells which in turn form the memory array of the entire SRAM device. The key to the reduction of device size as well as the increased device storage capacity is the reduction of the memory cells themselves that constitute the backbone of an SRAM device. FIG. 1 of the accompanying drawing of the present invention shows the schematic diagram of such a memory cell of the conventional SRAM device.

As is seen in FIG. 1, the typical memory cell of a conventional SRAM device comprises four MOS transistors and two resistors, they are, namely, the first, second, third and fourth MOS transistors T1, T2, T3 and T4, and the first and second resistors R1 and R2 respectively. The resistors R1 and R2 serve as load components in the memory cell of the SRAM device. Electrically, the first resistor R1 and the first MOS transistor T1 are connected in series across the first and the second voltages, namely the power $V_{DD}$ and the ground $V_{ss}$ potentials of the SRAM device. A similar arrangement is made as well for the second resistor R2 and the second transistor T2, as is observed in the drawing.

The gate of the first MOS transistor T1 is connected to the junction between the series connection of the second resistor R2 and the second MOS transistor T2. That junction is denoted as node B in the drawing. In a similar way, the gate of the second MOS transistor T2 is connected to the node A that is the junction between the first resistor R1 and the first MOS transistor T1.

The source/drain pair of the third MOS transistor T3 is connected between the A node and a first bit line BL of the very memory cell discussed herein. The gate of this third MOS transistor T3 is connected to the word line WL of this memory cell. In a similar arrangement, the fourth MOS transistor T4 has its source/drain pair connected between the B node and a second bit line $\overline{BL}$ of the memory cell, while its gate is also connected to the word line WL.

When the node A is supplied with a logically high voltage signal, via the third MOS transistor T3, as a result of memory cell access through the addressing of the bit BL and word line WL, the second MOS transistor T2 is placed in its conduction state, and the node B is consequently pulled to the ground potential (i.e., $V_{ss}$) of the system. As a result of the pulling down of node B, the first MOS transistor T1 is also forced into its blocking state, ensuring that the potential at the node A is maintained at the logical high state, nearly that of the system $V_{DD}$ voltage. On the other hand, when the node A is supplied with a logically low voltage signal, the second MOS transistor T2 will be placed in its blocking state, and the node B is consequently maintained at the $V_{DD}$ potential. This triggers the first MOS transistor T1 to enter its conduction state, ensuring that the potential at node B be maintained at the logical low state, nearly that of the system $V_{ss}$ voltage. Based on the inherent electrical potential holding nature of this logic circuitry, the memory cell can be used to statically store bits of data in the device.

Reference is now directed to FIG. 2 of the drawing, in which is shown the top view of the memory cell layout in the conventional SRAM device of FIG. 1, as fabricated onto, for example, a P-type semiconductor substrate. The field oxide layer 10 defines an active region 12 over the surface of the P-type semiconductor substrate 1. Layers of polysilicon 142, 144 and 146 are individually formed at selected locations on the active region 12 defined by the field oxide layer 10. Among these polysilicon layers, layer 142 is utilized as the gate terminal for the first MOS transistor T1, layer 144 is utilized as the gate terminal for the second MOS transistor T2, while layer 146 is utilized as the gate terminal for both the third and fourth MOS transistors T3 and T4, and is utilized as the word line WL for the memory cell. $N^+$-type doped regions are formed on the active region 12 at their respective locations to form the respective drain and source regions for the MOS transistors T1, T2, T3 and T4, as is seen in the layout view of FIG. 2. These $N^+$-type doped regions 122 are tied to system ground $V_{ss}$.

The polysilicon region 142 is electrically coupled to both the second MOS transistor T2 and the fourth MOS transistor T4 through buried contacts 162 and 164 respectively. The coupling forms the node B as is also indicated in the top view. The polysilicon layer 144, on the other hand, is coupled to both the first and third MOS transistors T1 and T3 via the buried contact 166 forming the A node also clearly indicated in the drawing. For the purpose of clarity in the description, the first and second resistors R1 and R2 that also constitute part of the memory cell as shown in the schematic diagram of FIG. 1 are not shown in the layout view, although it can be appreciated by persons skilled in this art that they may be located on top of the MOS transistors T1, T2, T3 and T4 in the form of polysilicon layers.

Further, the first and second bit lines BL and $\overline{BL}$ fabricated out of proper metal material are further formed over the surface of the first and second resistors R1 and R2. Contacts 182 and 84 may be used to couple the bit lines to the third and fourth MOS transistors T3 and T4 respectively.

Based on the above general description of the semiconductor structural configuration of the memory cell found in the conventional SRAM devices, it is obvious that the four MOS transistors that constitute the backbone of the memory cell occupy a great percentage of the surface area on the substrate for the memory cell. This is because they are substantially formed on the same level over the available surface area of the substrate. The total surface area consumed by these transistor devices thus is the primary factor that determines the size of the memory cell, which in turn determines the level of integration that is possible for the SRAM device.

SUMMARY OF THE INVENTION

It is therefore a primary object of the present invention to provide a process for fabricating SRAM memory cells that allows for the stacking of the constituting MOS transistors to reduce the total substrate surface area consumed.

The present invention achieves the above-identified object by providing a process for fabricating memory cells of a static random access memory (SRAM) device having a reduced die area and increased level of storage capacity. Each of the memory cells of the SRAM is composed of a group of four MOS transistors, a pair of resistors, a pair of bit lines, as well as a word line. The process of fabrication the memory cells of the SRAM device comprises a number of processing steps that are implemented subsequently on the surface of said semiconductor substrate, with the first and second MOS transistors formed on the semiconductor substrate first. Then the first and second resistors are subsequently formed on top of the first and second MOS transistors. Then the third and fourth MOS transistors and a word line are subsequently formed on top of the first and second resistors. The process finally forms the first and second bit lines for the memory cells further on top of the third and fourth MOS transistors. The process for fabricating the memory cells is characterized by the fact that the third and fourth MOS transistors are fabricated as vertical conduction transistors having their drains, sources and gates aligned substantially in a direction orthogonal to the plane of the semiconductor substrate.

BRIEF DESCRIPTION OF THE DRAWING

Other objects, features and advantages of the present invention will become apparent by way of the following detailed description of the preferred but nonlimiting embodiment. The description is made with reference to the accompanied drawings, wherein.

DETAILED DESCRIPTION OF THE PREFERRED EMBODIMENTS

Figure 1:
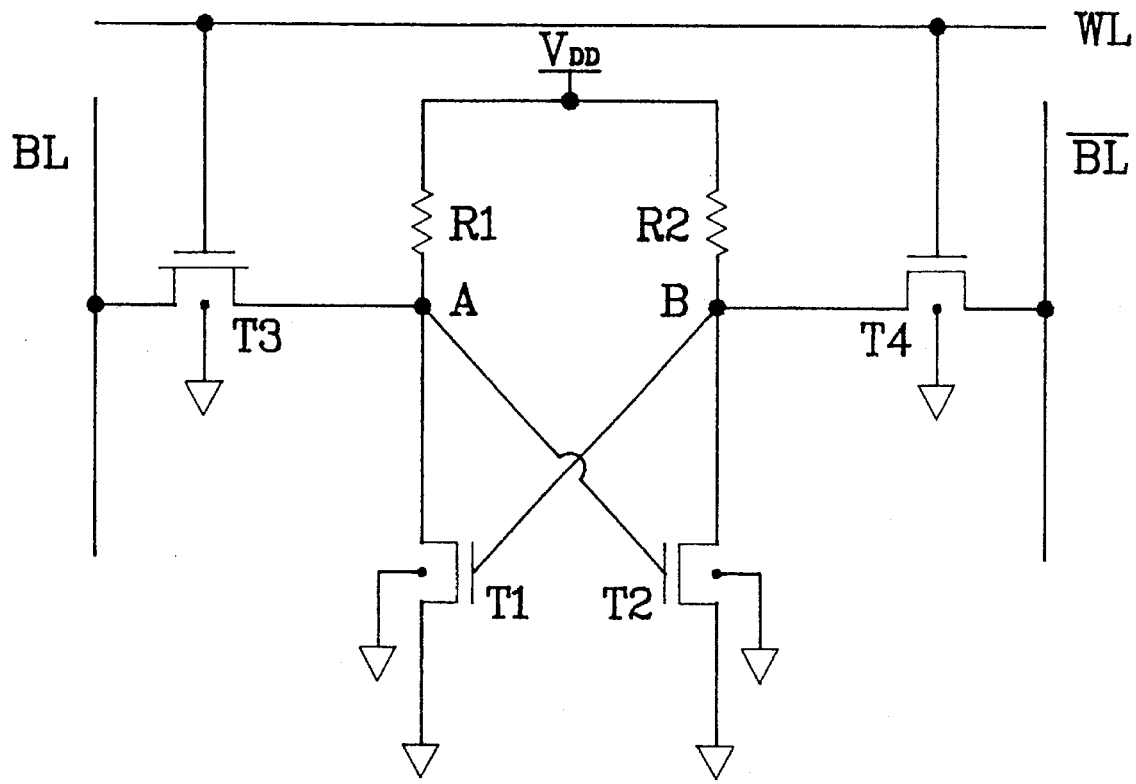
FIG. 1 shows the schematic diagram of a memory cell for a conventional SRAM device.
Figure 3:
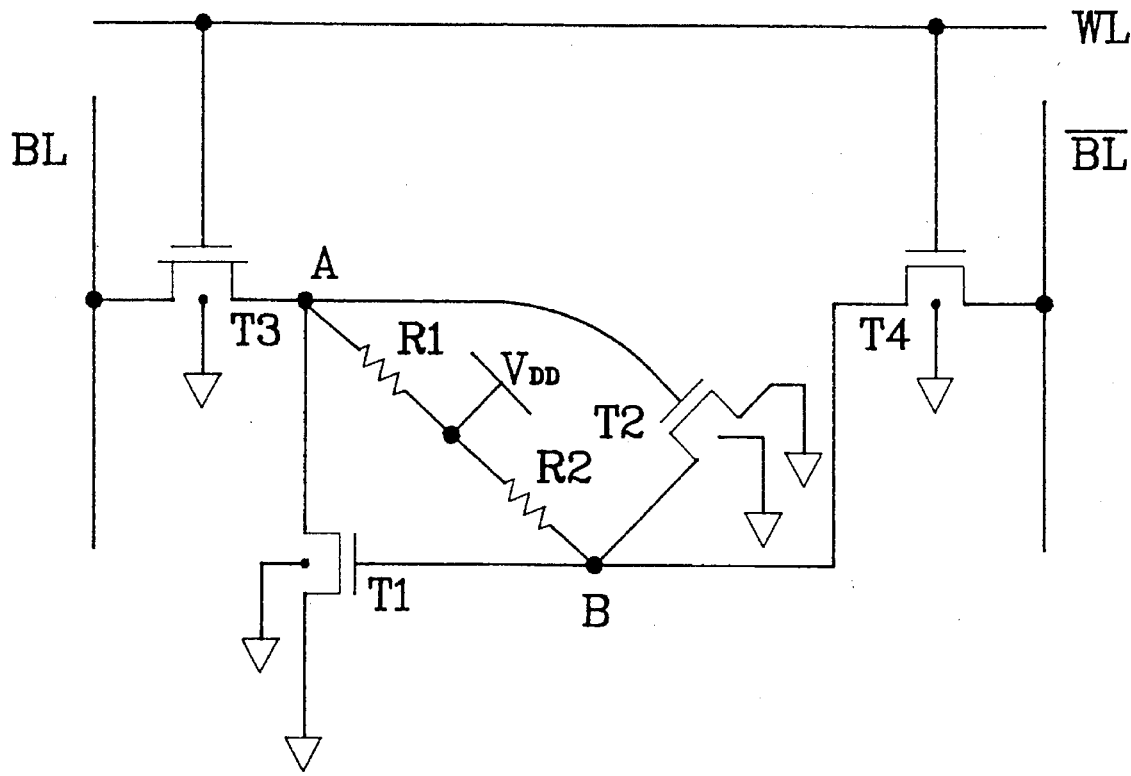
FIG. 3 shows the schematic diagram of a memory cell for the SRAM device fabricated in accordance with a preferred embodiment of the present invention.
Figure 2:
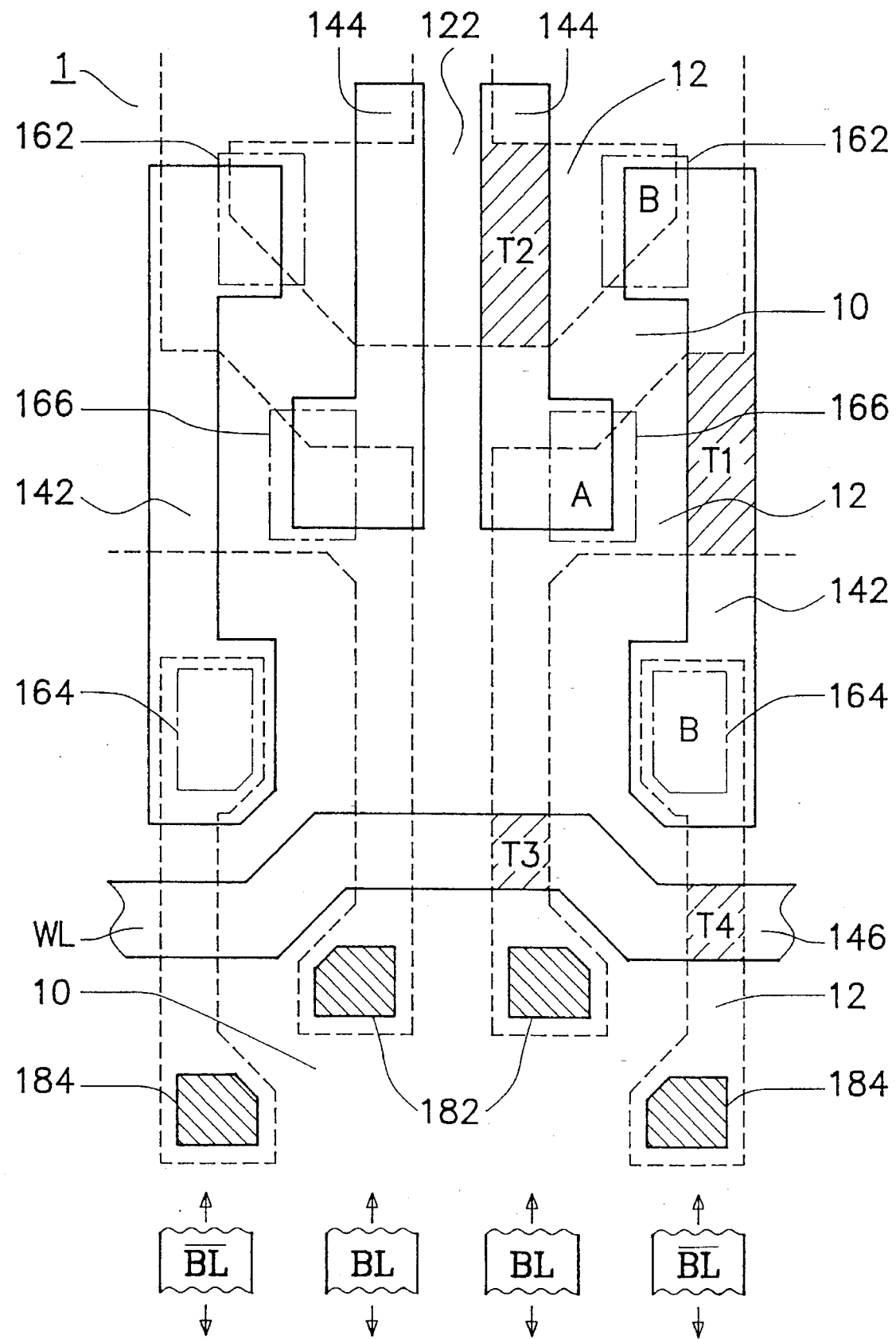
FIG. 2 schematically shows the top view of the layout of the memory cell of the conventional SRAM device of FIG. 1 as fabricated onto a semiconductor substrate.

Refer to FIG. 3 of the drawing. FIG. 3 shows a schematic diagram of a memory cell for the SRAM device fabricated in accordance with a preferred embodiment of the present invention. FIG. 3 schematically express the idea of the present invention. Namely, in the drawing of FIG. 1, the cross-over point required for coupling the gate of the first MOS transistor T1 to the node B, as well as the cross-over point required by the gate of the second MOS transistor T2 to couple to the node A, may be physically discarded, when the memory cell of the SRAM device fabricated in accordance with the disclosure of the present invention is implemented in the physical semiconductor structural configuration.

Figure 4:
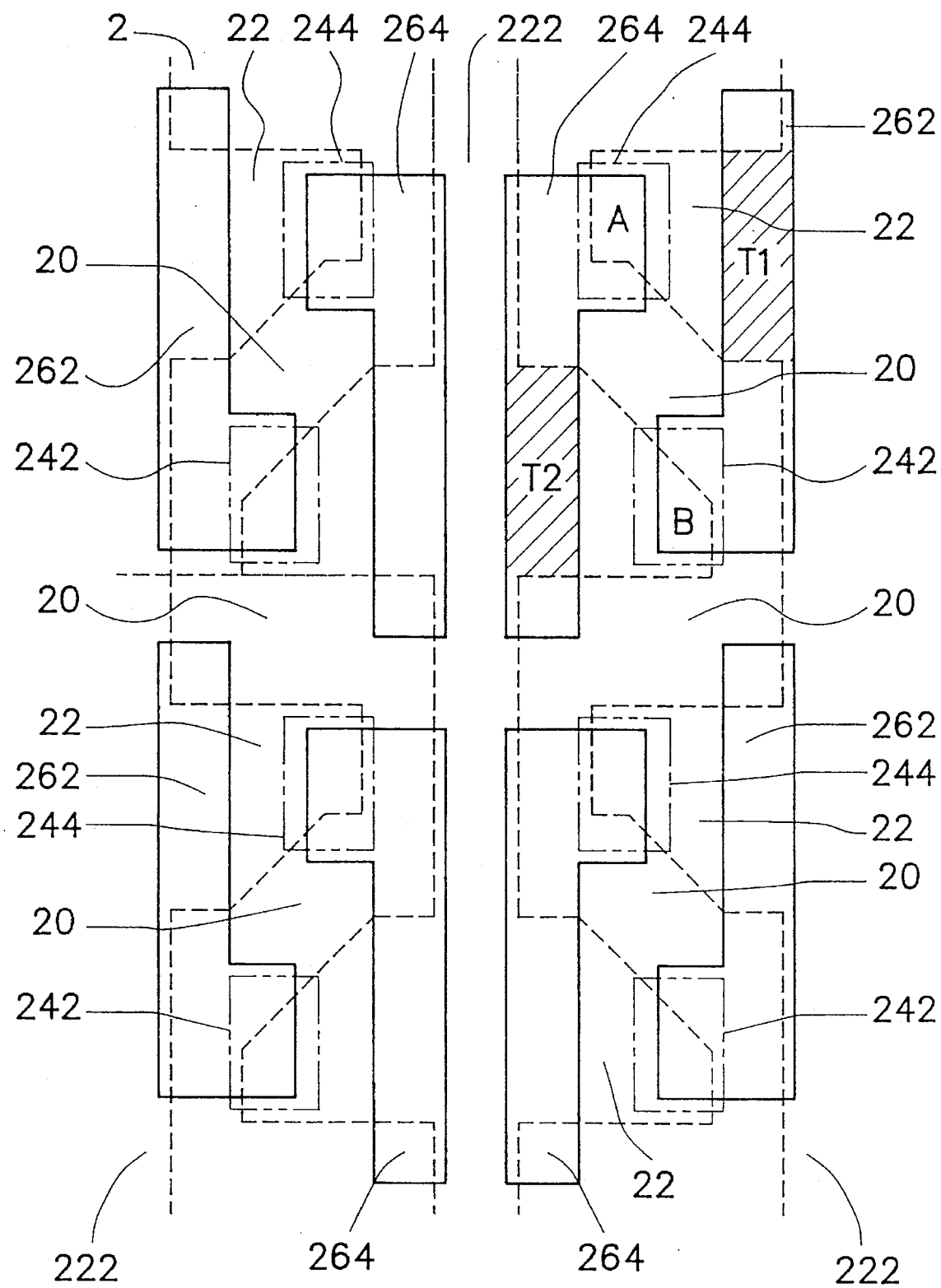
FIG. 4 schematically shows a top view depicting the layout of the first and second MOS transistors employed in the memory cell of the SRAM device of the preferred embodiment of FIG. 3.

Refer now to FIG. 4 of the drawing. FIG. 4 schematically shows the top view, which depicts the layout of the first and second MOS transistors T1 and T2 employed in the memory cell of the SRAM device of the preferred embodiment of FIG. 3. A field oxide layer 20 is defined over the designated location on a semiconductor substrate 2 to define an active region 22. The substrate may be either the N- or P-type, although a P-type substrate is employed for the purpose of the description of the present invention. Gate oxide layers are then formed on the active field oxide layer 20, and the locations prepared for the buried contacts 242 and 244. Polysilicon layers 262 and 264 are then formed at selected locations which are further doped with impurities to form the $N^+$-type doped regions. These $N^+$ doped regions are utilized as the drain and source terminals for the first and second MOS transistors T1 and T2 respectively. One particular $N^+$-type doped region 222 is utilized to couple the device to system ground voltage $V_{SS}$.

Among the fabricated polysilicon layers, layer 262 is utilized as the gate for the first MOS transistor T1, while being simultaneously coupled to the second MOS transistor T2 via the buried contact 242. This coupling forms the node B that physically connects the gate of the first MOS transistor T1, one of the drain/source terminals of the second MOS transistor T2, and a terminal of the second resistor R2 together, as is shown in the schematic diagram of FIG. 3. On the other hand, the polysilicon layer 264 is utilized as the gate for the second MOS transistor T2, while being simultaneously coupled to the first MOS transistor T1 via the buried contact 244. This coupling, in a manner similar to that of the case of node B, forms the node A that connects together the one of the drain/source terminals of the first MOS transistor T1, the gate of the second MOS transistor T2, and the one terminal of the first resistor R1.

Figure 5:
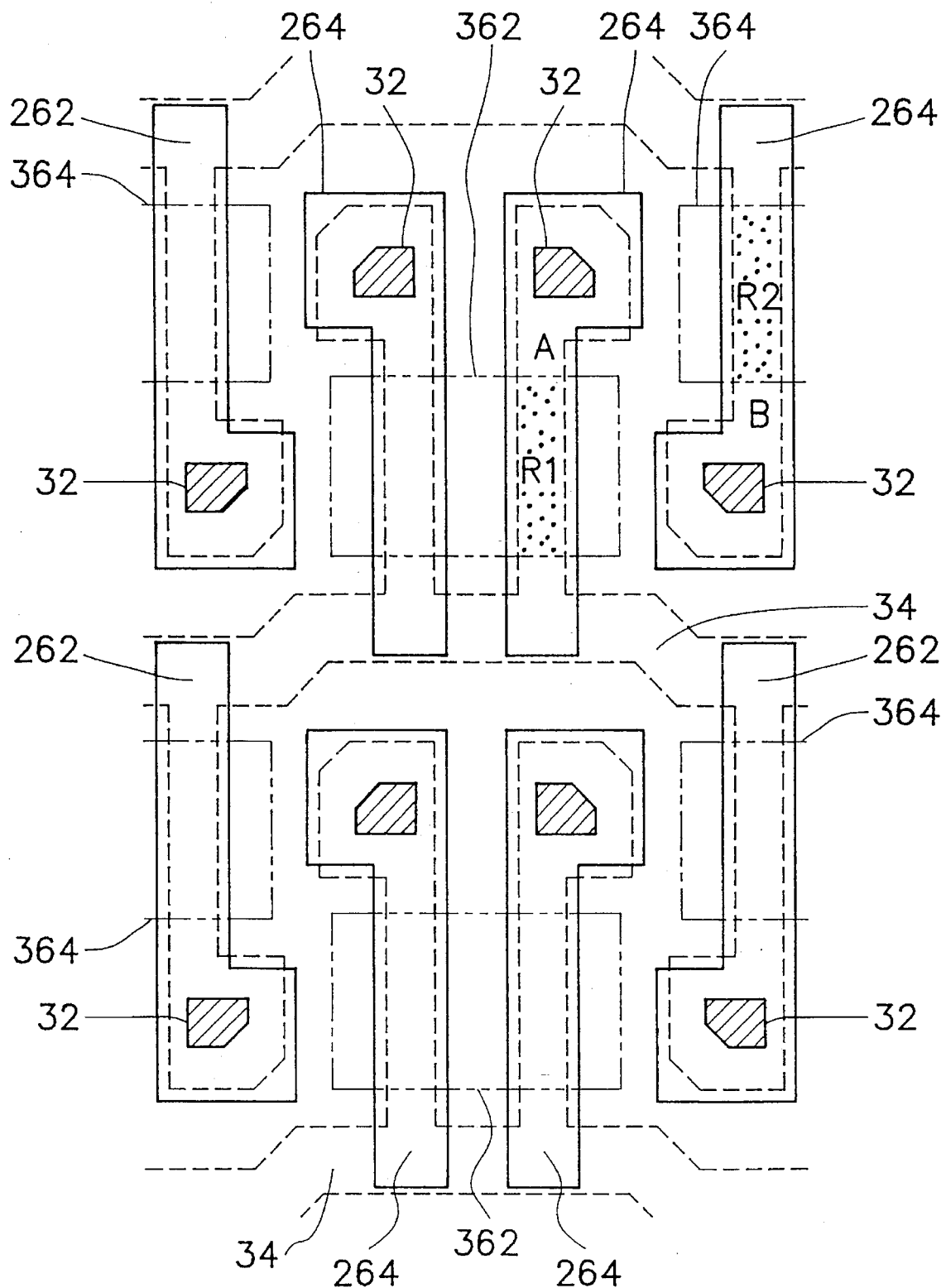
FIG. 5 schematically shows a top view depicting the layout of the first and second resistors employed in the memory cell of the SRAM device of the preferred embodiment of FIG. 3.

Refer next to FIG. 5. FIG. 5 schematically shows the top view that depicts the layout of the first and second resistors employed in the memory cell of the SRAM device of the preferred embodiment of FIG. 3. As is seen in the layout diagram, an insulation layer 30 (referring to FIG. 7) of, for example, oxides may be formed on top of the first and second MOS transistors T1 and T2 as shown in FIG. 4. Locations for the contacts 32 are then prepared on the insulation layer 30 over the polysilicon layers 262 and 264 respectively. Polysilicon layers 34 are then formed and contact the polysilicon layers 262 and 264 via the contacts 32. After these steps, implantation masks 362 and 364 may be applied and the ion implantation procedure implemented to implant impurities so as to reduce the electrical impedance characteristics in the regions not shielded by the masks 362 and 364. The implanted region forms the electrical conductor path that is coupled to the system power source $V_{DD}$, and the shielded regions that retain their relatively larger electrical impedance are then utilized as the first and second resistors R1 and R2 for the memory cell.

Figure 6:
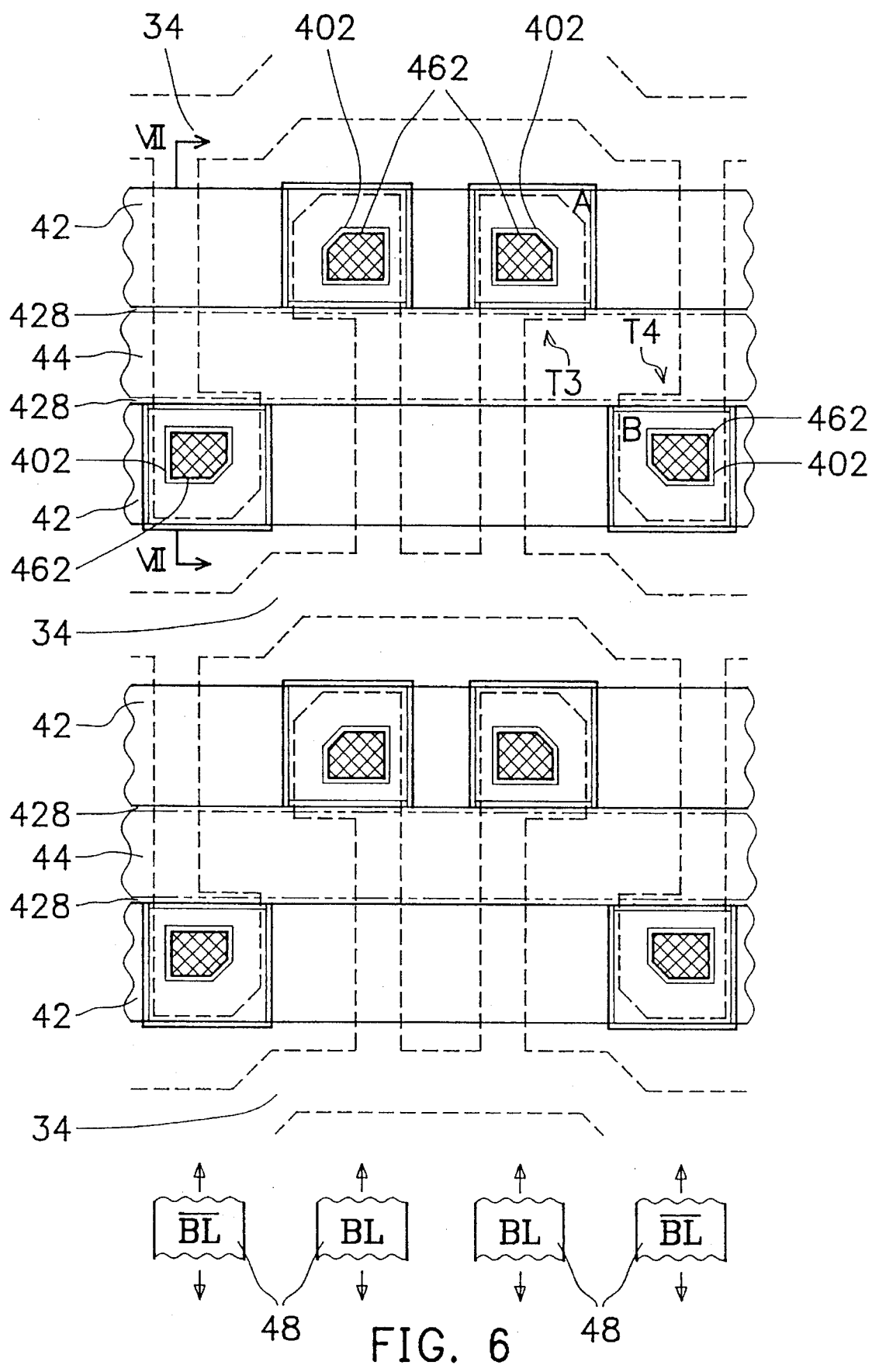
FIG. 6 schematically shows a top view depicting the layout of the third and fourth MOS transistors employed in the memory cell of the SRAM device of the preferred embodiment of FIG. 3.
Figure 7:
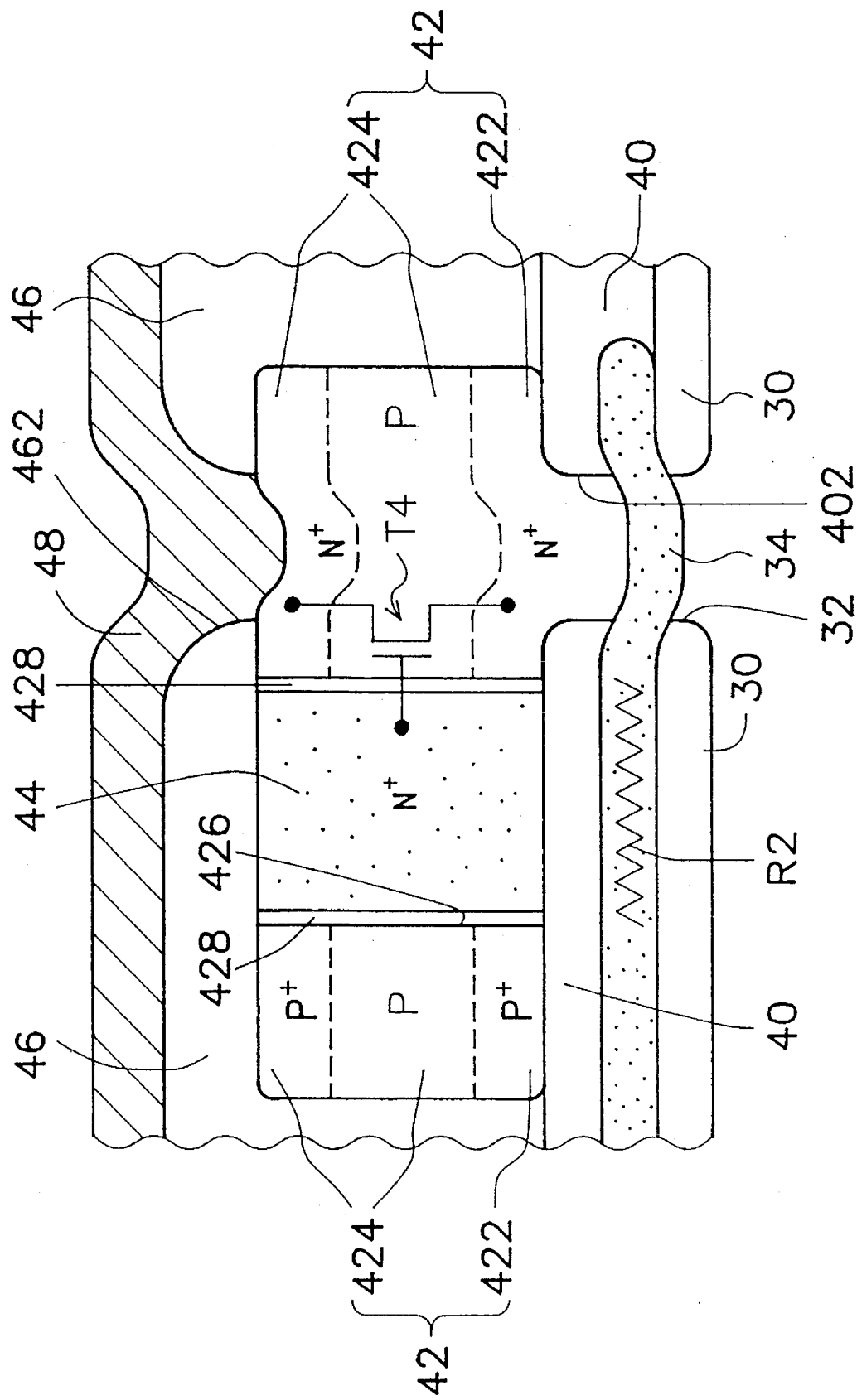
FIG. 7 schematically shows a cross-sectional view of the MOS transistors as taken along the VII—VII line in FIG. 6.

Refer to FIG. 6 and 7 simultaneously. FIG. 6 schematically shows the top view of the layout of the third and fourth MOS transistors employed in the memory cell of the SRAM device of the preferred embodiment of FIG. 3, while FIG. 7 schematically shows the cross-sectional view of the MOS transistors as taken along the VII—VII line in FIG. 6. In this preferred embodiment, the third and fourth MOS transistors T3 and T4 are each fabricated as a vertical conduction transistor. The word line and bit line of the memory cell also constitute the gate terminals of the third and fourth MOS transistors T3 and T4. This is done in the cross-sectional view of FIG. 7 by, for example, forming insulation layer 40 of, for example, oxides that cover the first and second resistors R1 and R2. After the formation of the insulation layer 40, a contact window 402 is opened in both the insulation layer 40 and the polysilicon layer 34.

Then, a polysilicon layer 42 comprising the sub layers 422 and 424 is formed by, for example, deposition, on top of the insulation layer 40, with the portions of the layers 422 and 424 immediately above the contact window 402 subjected to a series of ion implantation procedures that constructs the third and fourth MOS transistors T3 and T4 as shown in the top view of FIG. 6. The MOS transistors T3 and T4 are, however, characterized by their vertically oriented structural configuration. This is more clearly seen in the cross-sectional view, FIG. 7, of the memory cell as cut away along the VII—VII line in FIG. 6. The cross-sectional view exposes only one of the two MOS transistors, namely transistor T4, which, however, is sufficient to show the structural configuration of these vertical conduction transistors.

The construction of the third and fourth MOS transistors T3 and T4 are, as indicated above, via the implementation of a series of ion implantation procedures. Specifically, the polysilicon layers 422 and 424 are subsequently implanted with suitable impurities to become the $N^+$, P, and $N^+$ type layer regions, as is schematically shown in the cross-sectional view of FIG. 7. These layers of controlled impurity concentration with preset polarity form the drain, channel and source of the MOS transistor T4, with all layers substantially stacked in the vertical direction, orthogonal to the plane of the substrate. A similar structural configuration for the third MOS transistor T3 may be accomplished as well, with the drain/channel/source regions thereof arranged in a configuration that, although not shown in the cross-sectional view of FIG. 7, is substantially similar to that of the fourth MOS transistor T4.

Next, a vertical isolation groove 426 as shown in FIG. 7 is formed by, for example, etching into the depth of the polysilicon layer 42. The sidewalls of the groove 426 are then covered by the formation of gate oxide layers 428 before the groove 426 is filled with a depth of $N^+$ type polysilicon 44 by, for example, a deposition process. The path of the polysilicon 44, as defined by the pattern of the isolation groove 426, is utilized as the word line WL, as well as being utilized as the gate terminals for the third and fourth MOS transistors T3 and T4.

After the filling of the isolation groove 426, another insulation layer 46 formed of, for example, oxides, is then fabricated to cover both the polysilicon layers 42 and 44. Contact window 462 is then formed in the insulation layer 46 on top of the third and fourth MOS transistors T3 and T4. A metal layer 48 is then allowed to be formed on top of the insulation layer that also covers the contact window 462. The metal layer is shaped with suitable pattern as is schematically shown in the top view of FIG. 6 and be utilized as the first and second bit lines BL and $\overline{BL}$.

Figure 8:
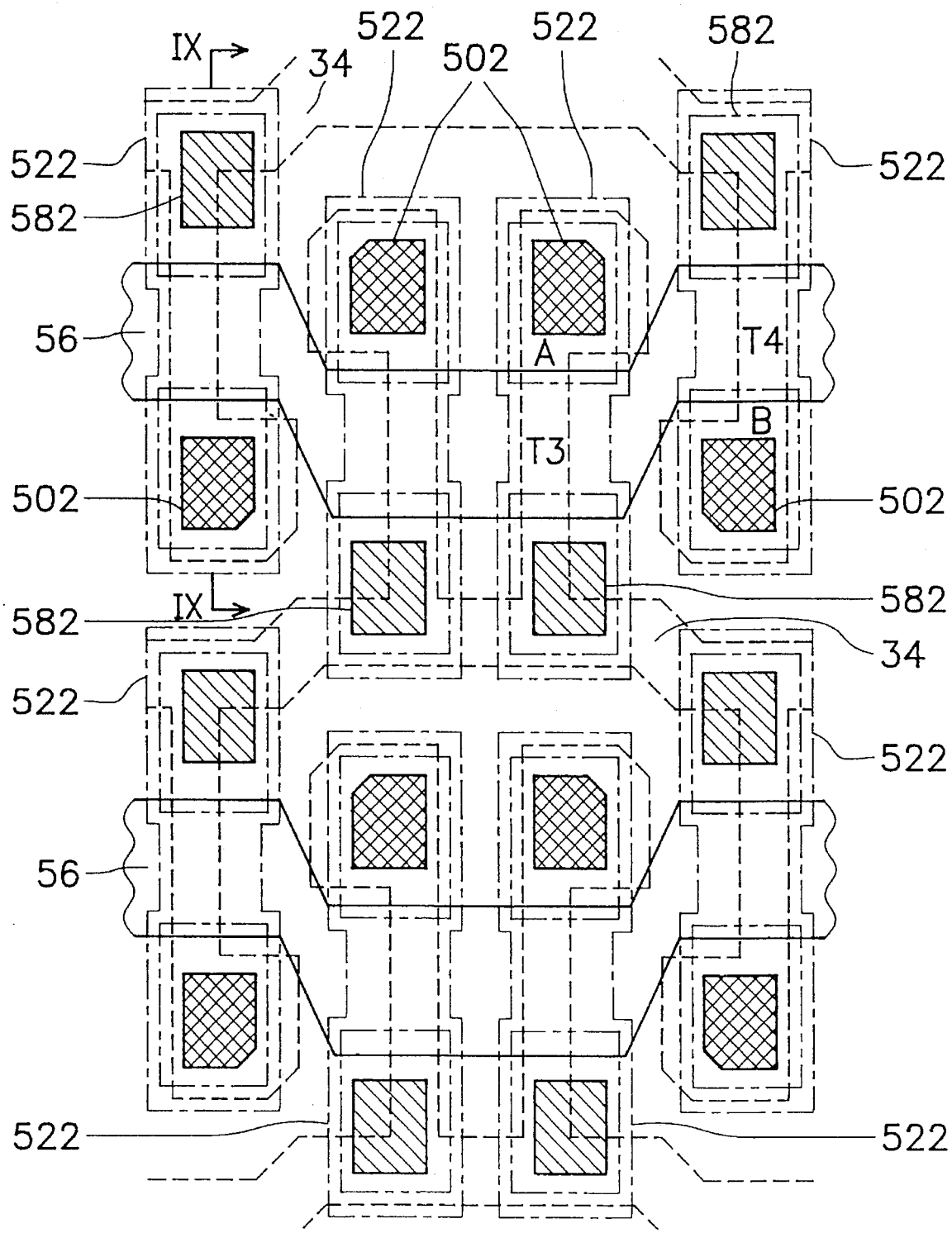
FIG. 8 schematically shows a top view depicting the layout of the third and fourth MOS transistors employed in the memory cell of the SRAM device in accordance with a second preferred embodiment of the present invention.
Figure 8:
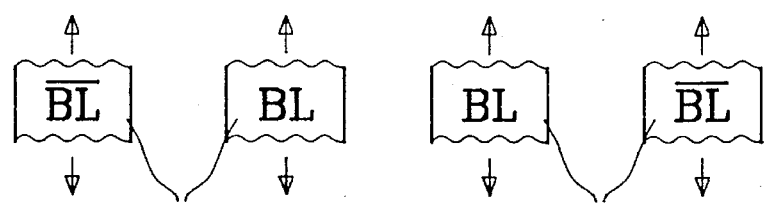
Figure 9:
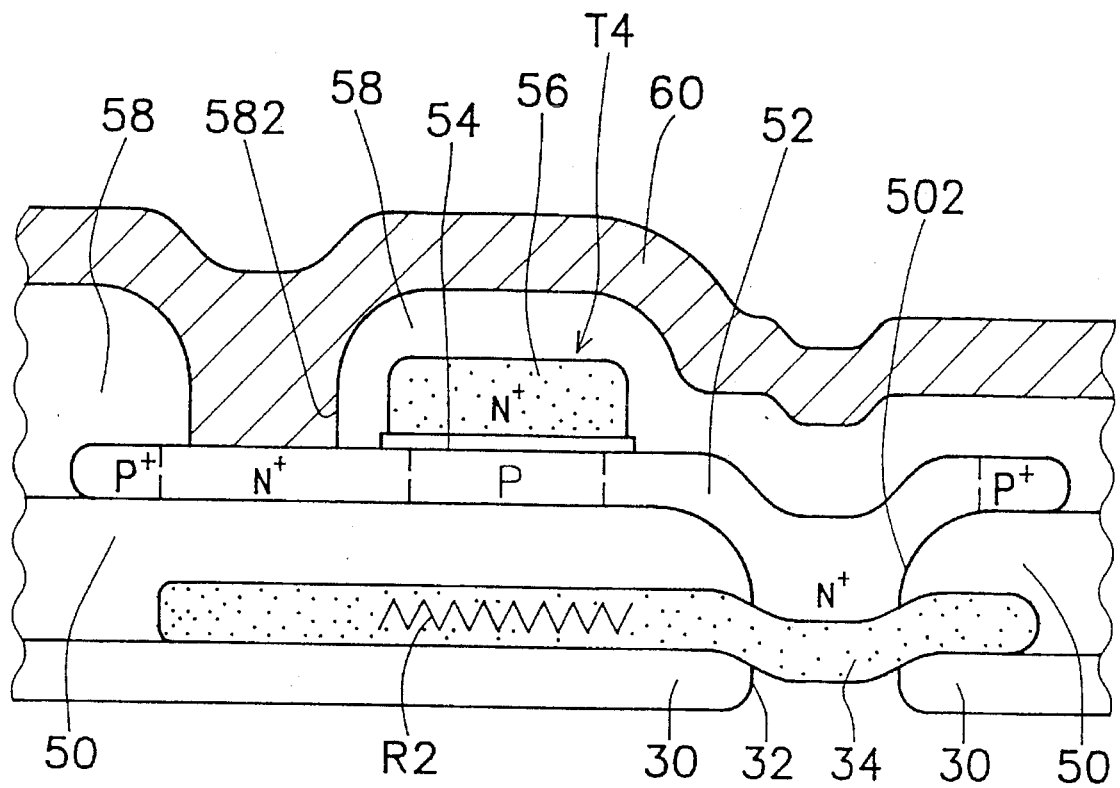
FIG. 9 is a cross-sectional view of the memory cell taken along the IX—IX line of FIG. 8.

Refer next to FIGS. 8 and 9. FIG. 8 schematically shows the top view depicting the layout of the third and fourth MOS transistors employed in the memory cell of the SRAM device in accordance with a second preferred embodiment of the present invention, while FIG. 9 is a cross-sectional view of the memory cell taken along the IX—IX line of FIG. 8. In this second embodiment of the present invention, the third and fourth MOS transistors T3 and T4 are constructed as plane conduction transistors. The word line WL described above constitutes the gates for the transistors T3 and T4 as well.

The construction of these plane conduction transistors T3 and T4 may be achieved by, for example, a process as described below. As is best seen in the cross-sectional view of FIG. 9, the process starts by covering the first and second resistors R1 and R2 with an insulation layer 50 formed by, for example, depositing a layer of oxide. An opening 502 for the contact is then prepared out of the insulation layer 50 at a predetermined location that exposes the polysilicon layer 34. Another polysilicon layer 52 is then formed covering a region of the insulation layer 50 that includes the opening 502. The entire polysilicon layer 52 is then subjected to a series of ion implantation procedures, which are carefully controlled to implement the $N^+$, P, and $N^+$ layer regions as schematically shown in the cross-sectional view of FIG. 9. These layer regions are utilized as the drain, channel and source terminals for both the third and fourth MOS transistors. In the top view of the layout of the memory cell as shown in FIG. 8, they are designated as regions 522. All regions of the polysilicon layer 52 other than the implanted layer regions 522 are processed to become $P^+$ regions then serve as isolation between the layer regions 522.

Next, gate oxide layer 54 and polysilicon layer 56 are then formed on top of the layer region that is utilized as the P-type channel for the MOS transistors which are also utilized as the word line WL and the gate terminals for the third and fourth MOS transistors T3 and T4. After the formation of the word line WL and the gate terminals, another insulation layer 58 of, for example, oxide is further formed over the polysilicon layers 52 and 56. Contact openings 582 are then prepared out of the insulation layer 58 at locations in the vicinity of the third and fourth MOS transistors T3 and T4. Afterwards, a metal layer 60 is then formed thereon that is employed as the bit lines BL and $\overline{BL}$ for the memory cell.

Figure 11:
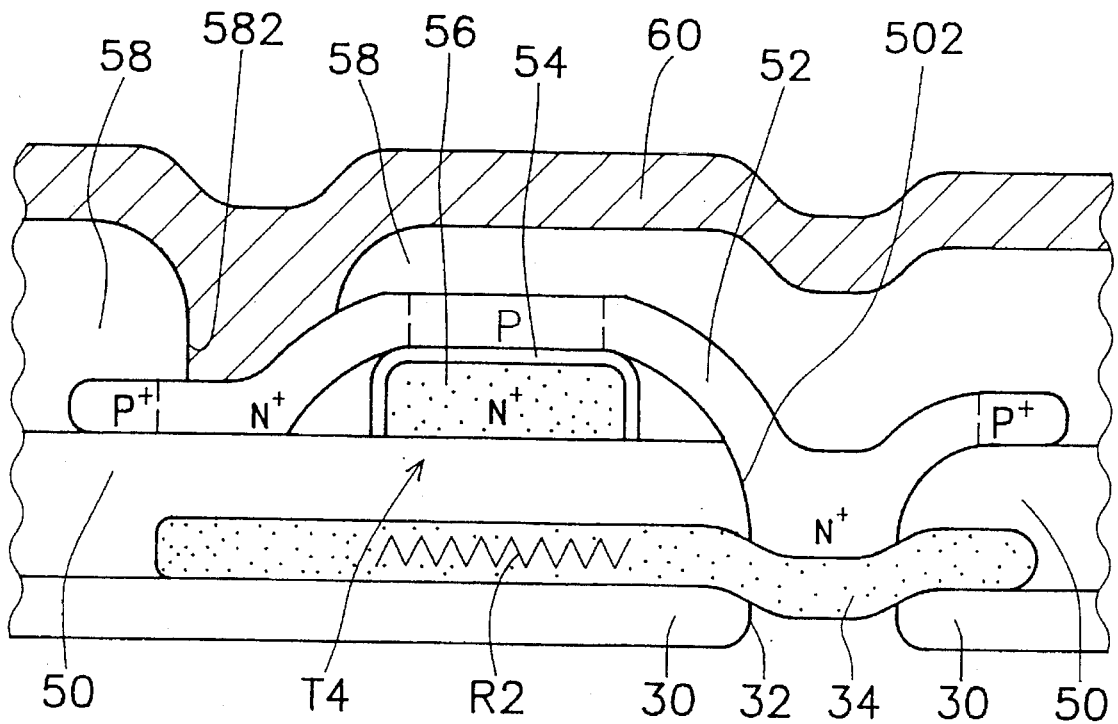
FIG. 11 shows a cross-sectional view of the memory cell taken along the XI—XI line of FIG. 10.
Figure 10:
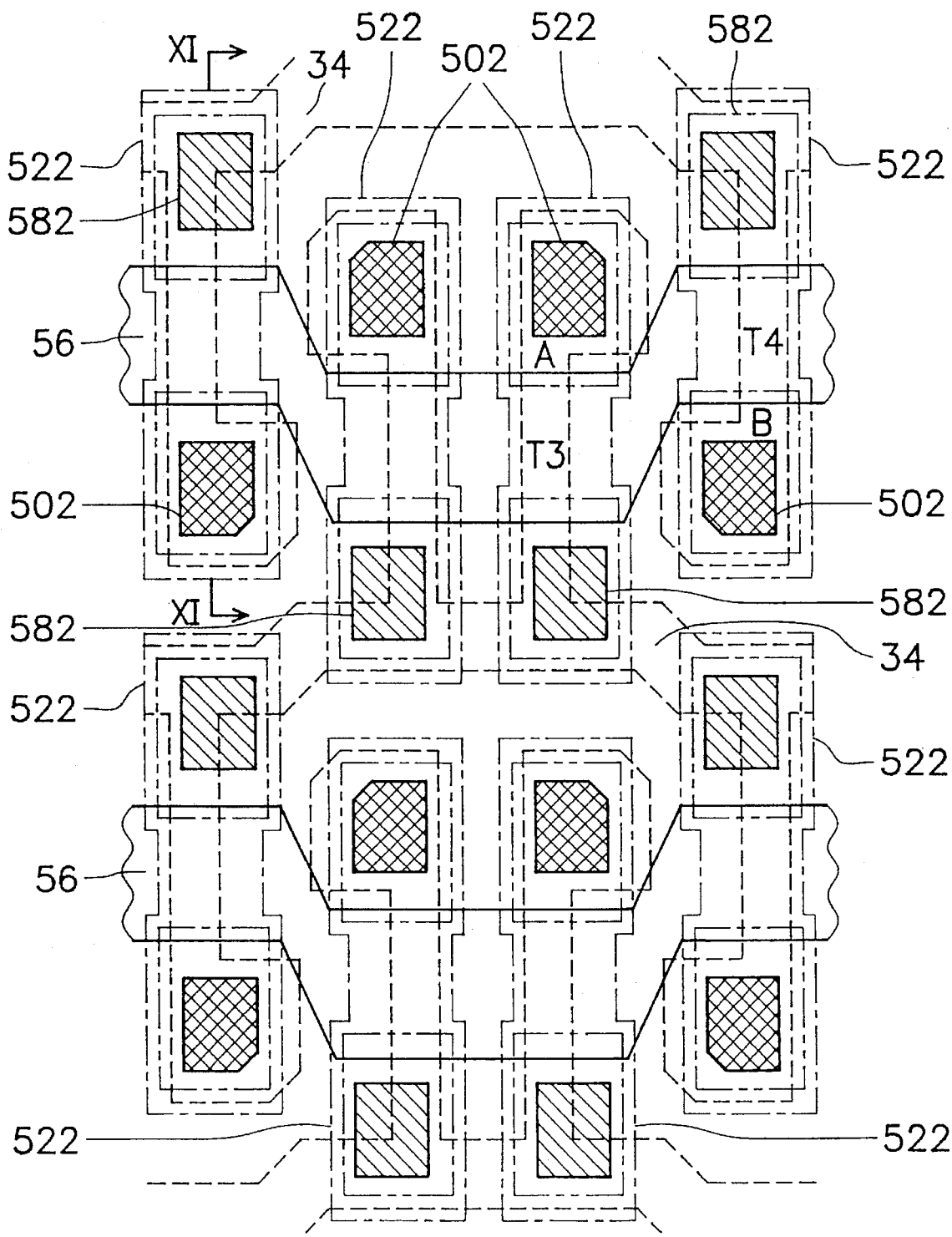
FIG. 10 schematically shows a top view depicting the layout of the third and fourth MOS transistors employed in the memory cell of the SRAM device in accordance with a third preferred embodiment of the present invention.

Refer to FIGS. 10 and 11 of the drawing. FIG. 10 schematically shows a top view depicting the layout of the third and fourth MOS transistors employed in the memory cell of the SRAM device in accordance with a third preferred embodiment of the present invention, while FIG. 11 shows a cross-sectional view of the memory cell taken along the XI—XI line of FIG. 10. A comparison of FIGS. 10 and 11 to the corresponding FIGS. 8 and 9 described above shows that the polysilicon layers 52 in the third embodiment of FIGS. 10 and 11 are formed on top of the gate oxide 54 and the polysilicon layer 56. This is the only difference between the two embodiments, all other corresponding structural configuration arrangements are the same as in the second embodiment of FIGS. 8 and 9. In the two embodiments, similar or equivalent structural configuration components are labeled with the same reference numeral so as to assist in the understanding and comparison of the two embodiments.

As is clearly described above, in one of the preferred embodiments of the present invention, the third and fourth MOS transistors that constitute the indispensable portion of the memory cell of an SRAM device are physically fabricated on top of the first and second transistors, respectively. In another preferred embodiment of the present invention, the third and fourth MOS transistors are fabricated as vertical conduction transistors. In either case, such arrangements allow the memory cell of the present invention to occupy a reduced over-all die area, which is directly translated into reduced device size as well as reduced cost.

Thus, the present invention is described in terms of the exemplified embodiments but, as persons skilled in the art can appreciate, these embodiments may be modified without departing from the scope of the present invention.

What is claimed is:

1. A process for fabricating memory cells of a static random access memory (SRAM) device having a plurality of memory cells formed on a semiconductor substrate, each of said SRAM memory cells includes:

a first MOS transistor having one of a drain/source pair thereof coupled to a first voltage for said SRAM device;

a second MOS transistor having one of the drain/source pair thereof coupled to said first voltage, the other of the drain/source pair thereof being coupled to the gate of said first MOS transistor and forming a second node, and the gate of said second MOS transistor being coupled to the other of said drain/source pair of said first MOS transistor and forming a first node;

a first resistor coupled to said first node at one end and to a second voltage at the other;

a second resistor coupled to said second node at one end and to said second voltage at the other;

a third MOS transistor having drain/source pair coupled to said first node and a first bit line, and a gate thereof coupled to a word line, respectively; and a fourth MOS transistor having a pair of drain/source coupled to said second node and a second bit line, and gate thereof coupled to said word line, respectively;

wherein said process comprises:
      forming said first and second MOS transistors on said semiconductor substrate;
      forming said first and second resistors over said first and second MOS transistors, respectively;
      forming said third and fourth MOS transistors and said word line over said first and second resistors, and
      forming said first and second bit lines over said third and fourth MOS transistors, respectively.

2. The process for fabricating memory cells of SRAM device of claim 1, wherein each of said third and fourth MOS transistors is fabricated as a vertical conduction transistor having the drain, source and gate thereof aligned substantially in a direction orthogonal to a plane of said semiconductor substrate.

3. The process for fabricating memory cells of SRAM device of claim 2, wherein said word line is utilized as the gates of both of said third and fourth MOS transistors.

4. The process for fabricating memory cells of the SRAM device of claims 3, wherein said gates of each of said first, second, third and fourth MOS transistors and said first and second resistors are formed of polysilicon.

5. The process for fabricating memory cells of SRAM device of claim 1, wherein each of said third and fourth MOS transistors is fabricated as a plane conduction transistor having the drain, source and gate thereof aligned substantially in a direction parallel to the plane of said semiconductor substrate.

6. The process for fabricating memory cells of SRAM device of claim 5, wherein said word line is utilized as the gates of both of said third and fourth MOS transistors.

7. The process for fabricating memory cells of the SRAM device of claim 6, wherein said third and fourth MOS transistors are formed on top of said word line.

8. The process for fabricating memory cells of the SRAM device of claims 7, wherein said gates of each of said first, second, third and fourth MOS transistors and said first and second resistors are formed of polysilicon.

9. The process for fabricating memory cells of the SRAM device of claim 6, wherein said word line is formed on top of said third and fourth MOS transistors.

10. The process for fabricating memory cells of the SRAM device of claims 9, wherein said gates of each of said first, second, third and fourth MOS transistors and said first and second resistors are formed of polysilicon.

11. The process for fabricating memory cells of the SRAM device of claim 1, wherein said first and second MOS transistors are connected to said first and second resistors via contact windows.

12. The process for fabricating memory cells of the SRAM device of claim 1, wherein said first and second resistors are connected to said third and four MOS transistors via contact windows.

* * * * *